(12) United States Patent
Choi et al.

(10) Patent No.: US 10,084,025 B2
(45) Date of Patent: Sep. 25, 2018

(54) COLOR FILTER SUBSTRATE AND DISPLAY DEVICE HAVING THE SAME

(71) Applicant: LG DISPLAY CO., LTD., Seoul (KR)

(72) Inventors: Howon Choi, Paju-si (KR); YongMin Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/265,561

(22) Filed: Sep. 14, 2016

(65) Prior Publication Data

US 2017/0077187 A1 Mar. 16, 2017

(30) Foreign Application Priority Data

Sep. 14, 2015 (KR) .................... 10-2015-0129411

(51) Int. Cl.
*H01L 27/32* (2006.01)
*H01L 51/52* (2006.01)

(52) U.S. Cl.
CPC ........ *H01L 27/322* (2013.01); *H01L 51/5284* (2013.01)

(58) Field of Classification Search
CPC .............. H01L 27/322; H01L 51/5284; G09G 2330/021; G09G 3/3275; G09G 2310/08; G09G 3/3266; G09G 3/3258; G09G 2300/0426

See application file for complete search history.

(56) References Cited

U.S. PATENT DOCUMENTS

| | | | | |
|---|---|---|---|---|
| 2015/0053956 A1* | 2/2015 | Sato | ..................... | H01L 51/5246 257/40 |
| 2015/0362795 A1* | 12/2015 | Chen | ................. | G02F 1/133514 349/42 |
| 2016/0005381 A1* | 1/2016 | Yata | ...................... | G09G 3/2074 345/690 |
| 2016/0342017 A1* | 11/2016 | Park | ................. | G02F 1/133516 |

* cited by examiner

*Primary Examiner* — Kyoung Lee
(74) *Attorney, Agent, or Firm* — Birch, Stewart, Kolasch & Birch, LLP

(57) ABSTRACT

Discussed is a color filter substrate and a display device having the same. The color filter substrate prevents color filter layers or color patterns from being lost or broken during a production process. The color filter substrate is formed by forming connection patterns in the edges of red (R), blue (B), and green (G) color filter layers and red (R), blue (B), and green G) color patterns. The connection patterns and color patterns are simultaneously formed with the color filter layers.

21 Claims, 29 Drawing Sheets

COLOR FILTER SUBSTRATE AND DISPLAY DEVICE HAVING THE SAME

CROSS REFERENCE TO RELATED APPLICATION

This application claims priority from Korean Patent Application No. 10-2015-0129411, filed on Sep. 14, 2015, which is hereby incorporated by reference for all purposes as if fully set forth herein.

BACKGROUND OF THE INVENTION

1. Field of the Invention

The present invention relates to a color filter substrate and a display device that is equipped with the color filter substrate.

2. Description of the Related Art

As the telematics society has developed, the demand for a display device for displaying images has increased in various ways. Recently, various types of display devices have been utilized, such as a liquid crystal display device, a plasma display device, an organic light emitting display device, and the like.

The display device may include: a display area (Active Area (A/A)) that is formed of a plurality of sub-pixels and displays an image; and a non-display area (Non Active Area (N/A)) corresponding to pads disposed along the circumference of the display area (A/A).

The display device contains, in an area corresponding to the display area (A/A), a color filter substrate that is equipped with a color filter layer and a black matrix (BM).

The black matrix (BM) that is in the form of a matrix may be formed through a mask process and etching process after forming a metal (e.g., Cr) that has an excellent optical shielding feature or a black resin material on a substrate.

Particularly, an organic light emitting display device that has recently drawn attention as a display device may include, in each sub-pixel, an organic light emitting diode (OLED), which autonomously emits light, and a driving transistor that drives the OLED.

Each sub-pixel of the organic light emitting display device is divided into an emission area (EA) where an OLED is disposed and a non emission area (NEA) where a driving transistor, a switching transistor, and signal lines (a gate line, a data line, a voltage supply line, and the like) are disposed. When an organic light emitting layer that is disposed in the OLED is an organic light emitting layer that generates white (W) light, a color filter substrate is needed, which includes a color filter layer corresponding to the EA of each sub-pixel and a BM corresponding to an NEA.

However, the BM requires a separate mask process and etching process, and thus, the production process becomes complex and the production costs increase, which is a drawback.

Therefore, a technology that omits a BM from a color filter substrate used for a display device has been suggested in various ways.

SUMMARY OF THE INVENTION

An aspect of the present invention is to provide a color filter substrate and a display device having the same, which simplify a production process by forming a shielding layer that is formed of red (R), blue (B), and green (G) color patterns, when the red (R), blue (B), and green (G) color filter layers are formed.

Another aspect of the present invention is to remove a bluish, greenish or reddish defect in sub-pixels.

Also, another aspect of the present invention is to provide a color filter substrate and a display device having the same, which prevent color filter layers or color patterns from being lost or broken during a process, by forming connection patterns in the edges of R, B, and G color filter layers and R, B, and G color patterns which are formed simultaneously with the color filter layers.

Also, another aspect of the present invention is to provide a color filter substrate and a display device having the same, which prevent the damage to color patterns during a process, by forming connection patterns that connect the color patterns or increase the widths of the color patterns of a shielding layer disposed in the non-emission area of each sub-pixel.

To solve or address the problems of the related art, a color filter substrate in a display panel according to an embodiment of the present invention includes a substrate configured to include a display area having an area of a plurality of sub-pixels, and a non-display area that is along the circumference of the display area. The color filter substrate further includes a color filter layer configured to include a first color filter, a second color filter, and a third color filter, which are disposed in an area corresponding to the sub-pixels and have different colors, an optical shielding unit configured to be disposed between the sub-pixels, and a first connection pattern unit and a second connection pattern unit, which are included in the non-display area, and are configured to connect both ends of the color filter layer and the optical shielding unit.

Another embodiment of the present invention is a display device that includes a lower substrate configured to include a display area having an area of a plurality of sub-pixels and a non-display area that is along the circumference of the display area, a driving transistor configured to be disposed on the lower substrate, a pixel electrode configured to be disposed on the driving transistor, a common electrode configured to be disposed on the pixel electrode, and a color filter substrate configured to include a color filter layer that is configured to be disposed in an area corresponding to the sub-pixels an optical shielding unit that is configured to be disposed between the sub-pixels, and a first connection pattern unit and a second connection pattern unit that are configured to be disposed in edges of the color filter layer and the optical shielding unit.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE EMBODIMENTS

Figure 1:
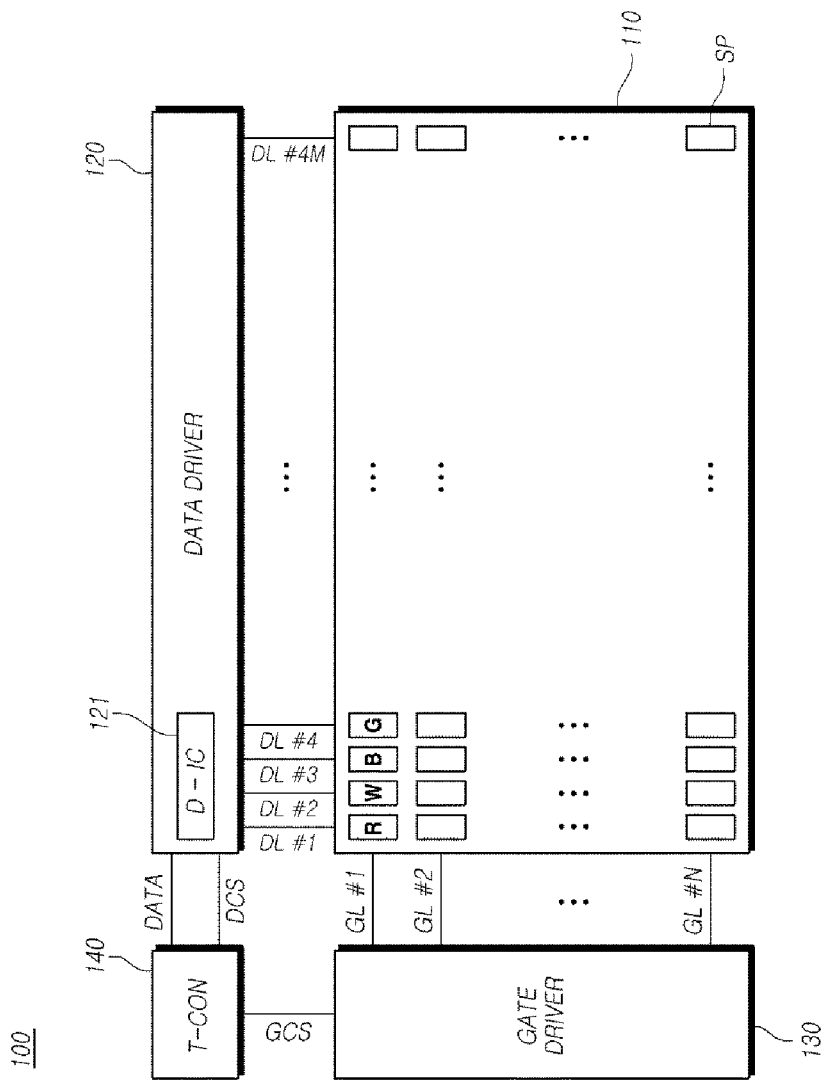
FIG. 1 is a schematic system configuration of an organic light emitting display device according to an embodiment of the present invention.

The advantages and features of the present invention and methods of achieving the same will be apparent by referring to embodiments of the present invention as described below in detail in conjunction with the accompanying drawings. However, the present invention is not limited to the embodiments set forth below, but may be implemented in various different forms. The following embodiments are provided only to completely disclose the present invention and inform those skilled in the art of the scope of the present invention, and the present invention is defined only by the scope of the appended claims.

The shapes, sizes, ratios, angles, numbers, and the like shown in the drawings for explaining embodiments of the present invention are illustrative, and therefore the present invention is not limited to the shown matters. Throughout the specification, the same or like reference numerals designate the same or like elements. Further, in the description of the present invention, when it is determined that the detailed description of the related well-known technologies unnecessarily make the subject matter of the present invention unclear, the detailed description will be omitted.

It should be understood that the terms 'include', 'have', 'comprise', and the like used in the present specification may further include other parts, unless the terms are used with 'only'. When an element is expressed in the singular, the singular is intended to include the plural as well, unless the context clearly indicates otherwise.

It should be construed that an element includes an error range when interpreting the element, unless otherwise indicated.

In association with the descriptions of the relation of position, for example, when the relation of the positions of two parts is described using 'on', 'in an upper portion', 'under', 'next to', and the like, at least one other part may be located between the two parts unless 'immediately' or 'directly' is used.

In association with the descriptions of the relation of time, for example, when the order of incidents is described using 'after', 'subsequent to', 'next to', ' before', and the like, it should be understood that the incidents may not successively happen unless 'immediately' or 'directly' is used.

It should be construed that, although the terms, 'first', 'second', and the like are used to describe various elements, these elements should not be limited by the terms. The terms are only used to distinguish one element from another. Therefore, a first element could be termed a second element within the technical idea of the present invention.

It should be understood that the features of the various embodiments of the present invention may be coupled or combined partially or generally, and may be driven and interwork technically in various ways, and the embodiments may be implemented independently from one another or may be connected and implemented together.

Hereinafter, the embodiments of the present invention will be described in detail with reference to the enclosed drawings. In the drawings, the size, the thickness, and the like of an apparatus may be expressed to be overstated for ease of description. Throughout the specifications, the same or similar elements will be designated by the same or similar reference numerals.

FIG. 1 is a schematic system configuration of an organic light emitting display device according to an embodiment of the present invention.

Referring to FIG. 1, an organic light emitting display device 100 according to an embodiment of the present invention includes: a display panel 110 in which a plurality of data lines (DL #1, DL #2, . . . , and DL #4M, M is a natural number greater than or equal to 1) are disposed in a first direction (e.g., a column direction), a plurality of gate lines (GL#1, GL#2. . . , and GL#N, N is a natural number greater than or equal to 1) are disposed in a second direction (e.g., a row direction), and a plurality of sub-pixels (SP) are disposed in a type of matrix; a data driver 120 that drives the plurality of data lines DL #1, DL #2, . . . , and DL #4M; a gate driver 130 that drives the plurality of gate lines GL #1, GL #2, . . . , and GL #N; and a timing controller (T-CON) 140 that controls the data driver 120 and the gate driver 130.

The data driver 120 supplies a data voltage to the plurality of data lines DL #1, DL #2, . . . , and DL #4M, and drives the plurality of data lines DL #1, DL #2, . . . , and DL #4M.

The gate driver 130 sequentially supplies a scan signal to the plurality of gate lines GL #1, GL #2, . . . , and GL #N, and sequentially drives the plurality of gate lines GL #1, GL #2, . . . , and GL #N.

The timing controller 140 supplies various control signals to the data driver 120 and the gate driver 130, and controls the data driver 120 and the gate driver 130.

The timing controller 140 starts scanning according to a timing implemented in each frame, converts image data input from the outside to be appropriate for a data signal format used in the data driver 120, outputs the converted image data (DATA), and controls driving data at a proper time in correspondence with scanning.

The gate driver 130 sequentially supplies a scan signal of an ON voltage or an OFF voltage to the plurality of gate lines GL #1, GL #2, . . . , and GL #N, and sequentially drives the plurality of gate lines GL #1, GL #2, . . . , and GL #N, under the control of the timing controller 140.

The gate driver 130 may be located in one side of the display panel 110 as illustrated in FIG. 1, depending on a driving scheme, or may be located in both sides in some cases.

Also, the gate driver 130 may include one or more gate driver integrated circuits.

Each gate driver integrated circuit may be connected to a bonding pad of the display panel 110 based on a Tape Automated Bonding (TAB) scheme or a Chip On Glass (COG) scheme, or may be embodied as a Gate In Panel (GIP) type and may be directly disposed in the display panel 110. In some cases, the gate driver integrated circuit may be disposed by being integrated with the display panel 110.

Each gate driver integrated circuit may include a shift register, a level shifter, and the like.

When a predetermined gate line is open, the data driver 120 converts image data (DATA) received from the timing controller 140 into an analog-type data voltage, and supplies the same to the plurality of data lines DL #1, DL #2, . . . , and DL #4M so as to drive the plurality of data lines DL #1, DL #2, . . . , and DL #4M.

The data driver 120 may include at least one source driver integrated circuit (source D-IC) 121, so as to drive a plurality of data lines DL #1, DL #2, . . . , and DL #4M.

Each source driver integrated circuit 121 may be connected to a bonding pad of the display panel 110 based on a tape automated bonding (TAB) scheme or a chip on glass (COG) scheme, or may be directly disposed in the display panel 110. In some cases, the source driver integrated circuit 121 may also be integrated in the display panel 110.

Each source driver integrated circuit 121 may include: a logic unit including a shift register, a latch circuit, and the like; a digital analog converter (DAC); an output buffer; and the like. In some cases, each source driver integrated circuit 121 may further include a sensing unit for sensing the feature of a sub-pixel so as to adjust the feature of a sub-pixel (e.g., the threshold voltage or mobility of a driving transistor, the threshold voltage of an organic light emitting diode, the brightness of a sub-pixel, and the like).

Each source driver integrated circuit 121 may be embodied based on a chip on film (COF) scheme. In this instance, one end of each source driver integrated circuit 121 may be bonded to at least one source printed circuit board, and the other end may be bonded to the display panel 110.

The timing controller 140 may receive, from the outside (e.g., a host system), various timing signals including a vertical synchronization signal (Vsync), a horizontal synchronization signal (Hsync), an input data enable (DE) signal, a clock signal (CLK), and the like, together with input image data.

The timing controller 140 receives a timing signal, such as a vertical synchronization signal (Vsync), a horizontal synchronization signal (Hsync), an input DE signal, a clock signal, and the like, generates various control signals, and outputs the control signals to the data driver 120 and the gate driver 130, so as to control the data driver 120 and the gate driver 130, in addition to outputting image data that is obtained by converting image data input from the outside to be appropriate for the data signal format used by the data driver 120.

For example, the timing controller 140 may output various gate control signals (GCS) including a gate start pulse (GSP), a gate shift clock (GSC), a gate output enable (GOE) signal, and the like, for controlling the gate driver 130.

Here, the GSP controls an operation start timing of one or more gate driver integrated circuits that form the gate driver 130. The GSC is a clock signal that is commonly input to one or more gate driver integrated circuits, and may control the shift timing of a scan signal (gate pulse). The GOE signal designates timing information of one or more gate driver integrated circuits.

Also, the timing controller 140 may output various data control signals (DCS) including a source start pulse (SSP), a source sampling clock (SSC), a source output enable signal (SOE), and the like, so as to control the data driver 120.

Here, the SSP controls a data sampling start timing of one or more source driver integrated circuits 121 that form the data driver 120. The SSC is a clock signal that controls a sampling timing of data in each source driver integrated circuit 121. The SOE controls an output timing of the data driver 120.

Referring to FIG. 1, the timing controller 140 may be disposed in a control printed circuit board that is connected to a source printed circuit board to which the source driver IC 121 is bonded, through a connection medium, such as a flexible flat cable (FFC), a flexible printed circuit (FPC), or the like.

In the control printed circuit board, a power controller may be further disposed, which supplies various voltages or currents to the display panel 110, the data driver 120, the gate driver 130, and the like, or controls various voltages or currents to be supplied. The power controller is also referred to as a power management integrated circuit (power management IC).

The above described source printed circuit board and the control printed circuit board may be embodied as a single printed circuit board.

In the organic light emitting display device 100 according to an embodiment of the present invention, each sub-pixel (SP) disposed in the display panel 110 may be formed of circuit devices, such as an organic light emitting diode, two or more transistors, and at least one capacitor, and the like.

The types and the numbers of circuit devices forming each sub-pixel may be variously determined based on a providing function, a designing scheme, and the like.

Each sub-pixel in the display panel 110, according to an embodiment of the present invention, may be provided in a circuit structure for adjusting the characteristics of a sub-pixel, such as the characteristics of an organic light emitting diode (OLED) (e.g., a threshold voltage and the like), the characteristics of a driving transistor that drives an OLED (e.g., a threshold voltage, a mobility, and the like), and the like.

Figure 2:
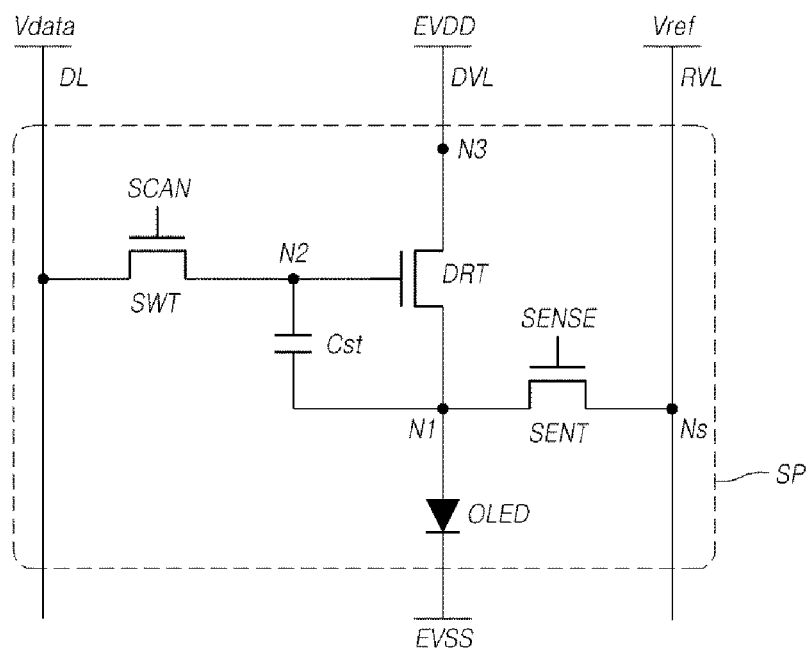
FIG. 2 is a diagram illustrating an example of a sub-pixel circuit of an organic light emitting display device according to an embodiment of the present invention.

FIG. 2 is a diagram illustrating an example of a sub-pixel circuit of an organic light emitting display device according to an embodiment of the present invention.

Referring to FIG. 2, each sub-pixel (SP) disposed in the display panel 110 according to an embodiment of the present invention may include: an OLED; a driving transistor (DRT) that drives the OLED; a switching transistor (SWT) that is connected between a data line (DL) and a second node (N2) of the DRT, and transfers a data voltage (Vdata) to the N2 of the DRT; a storage capacitor (Cst) that maintains a predetermined voltage during a single frame of time; a sensing transistor (SENT) that is electrically connected between a first node (N1) of the DRT and a reference voltage line (RVL) that supplies reference voltage (Vref); and the like.

Referring to FIG. 2, the OLED is formed of a first electrode (e.g., an anode electrode or a cathode electrode), an organic layer, and a second electrode (e.g., a cathode electrode or an anode electrode).

For example, the first electrode of the OLED may be connected to the first node (N1) of the driving transistor (DRT), and the second electrode of the OLED may be connected to a part that supplies a base voltage (EVSS).

Referring to FIG. 2, the driving transistor (DRT) is a transistor that supplies a driving current to the OLED and drives the OLED. The DRT includes a first node (N1) corresponding to a source node or a drain node, a second node (N2) corresponding to a gate node, and a third node (N3) corresponding to a drain node or a source node.

For example, the first node (N1) of the DRT may be electrically connected to the first electrode or the second electrode of the OLED.

Also, the first node (N1) of the DRT may be electrically connected to the source node or the drain node of the sensing transistor (SENT). The second node (N2) of the DRT may be electrically connected to the source node or the drain node of the switching transistor (SWT), and the third node (N3) may be electrically connected to the driving voltage line (DVL) that supplies a driving voltage (EVDD).

Referring to FIG. 2, the switching transistor (SWT) is a transistor that transfers a data voltage (Vdata) to the N2 corresponding to the gate node of the driving transistor (DRT). The SWT is electrically connected between the data line (DL) and the node N2 of the DRT, and may be turned on by a scan signal (SCAN) provided to the gate node and may transfer the data voltage (Vdata) to the N2 of the DRT.

Referring to FIG. 2, the storage capacitor (Cst) may be electrically connected between the first node (N1) and the second node (N2) of the DRT.

Referring to FIG. 2, the sensing transistor (SENT) may be electrically connected between the first node of the driving transistor (DRT) and a reference voltage line (RVL), and may be controlled by a sense signal (SENSE) that is of a type of a scan signal supplied to a gate node. Here, a point in the reference voltage line (RVL) may correspond to a sensing node (Ns).

The sensing transistor (SENT) may be turned on, and may provide the first node (N1) of the driving transistor (DRT) with a reference voltage (Vref) supplied through the reference voltage line (RVL).

Referring to FIG. 2, the gate node of the switching transistor (SWT) and the gate node of the sensing transistor (SENT) may be electrically connected to an identical gate line, and may be provided with an identical gate signal. In this instance, a scan signal (SCAN) and a sense signal (SENSE) are an identical gate signal.

Unlike the above, the gate node of the switching transistor (SWT) and the gate node of the sensing transistor (SENT) may be electrically connected to different gate lines. In this instance, a scan signal (SCAN) and a sense signal (SENSE) are different gate line signals.

Each driving transistor (DRT) may have characteristics, such as a threshold voltage (Vth), mobility, and other electrical characteristics. Also, the characteristics of the DRT may change since the DRT degrades as a driving time elapses.

In addition to the variation in characteristics between the DRTs (e.g., a threshold voltage variation and a mobility variation), the variation in characteristics between OLEDs (e.g., a threshold voltage variation) may exist.

The organic light emitting display device 100, according to an embodiment of the present invention, may sense a sub-pixel characteristic variation. In this instance, the organic light emitting display device 100 may sense, through driving sensing, a voltage on a reference voltage line (RVL), which is in a predetermined voltage state, and converts the sensed voltage into a digital value.

Figure 3:
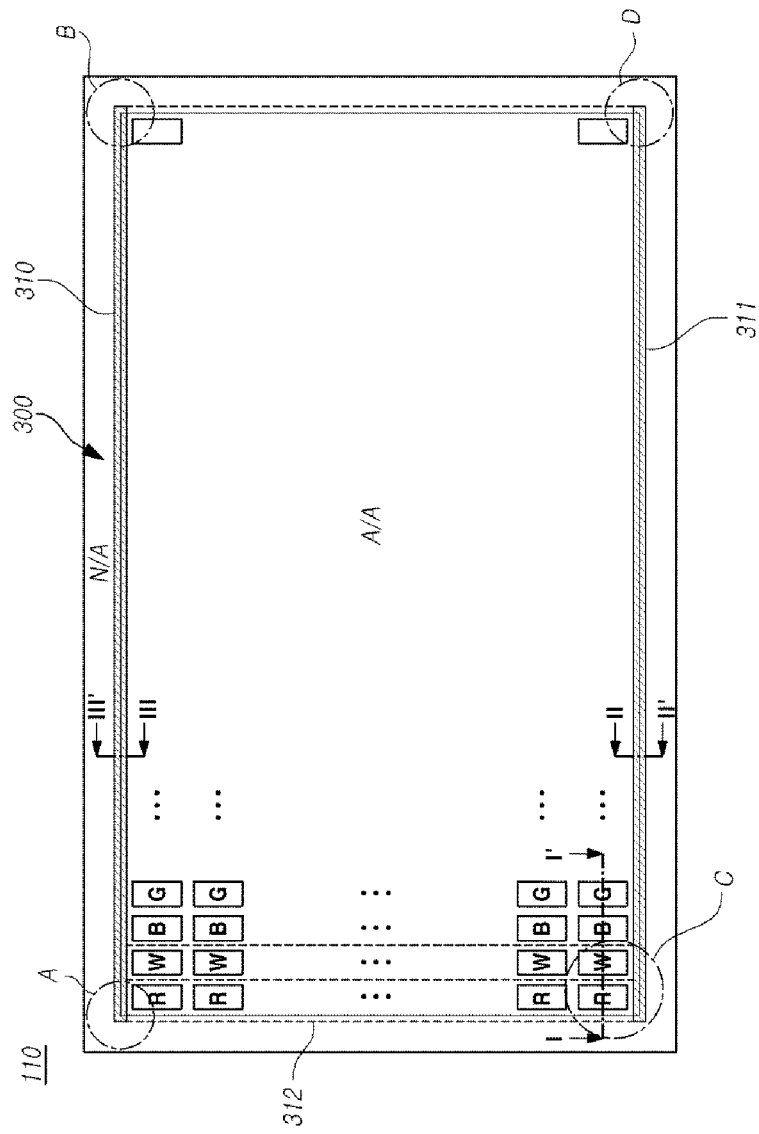
FIG. 3 is a diagram illustrating a structure of a display panel of an organic light emitting display device according to an embodiment of the present invention.
Figure 4:
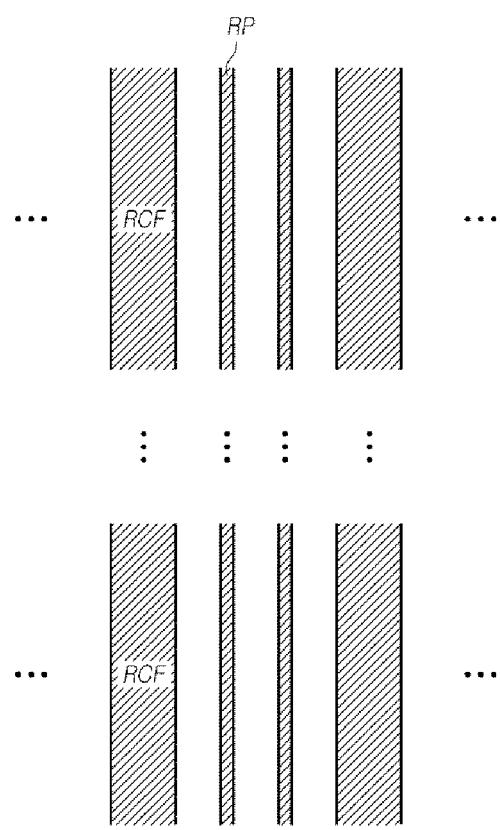
FIGS. 4 to 6 are diagrams illustrating a structure of a color filter layer disposed in an organic light emitting display device and a color pattern of a corresponding color filter layer according to an embodiment of the present invention.
Figure 5:
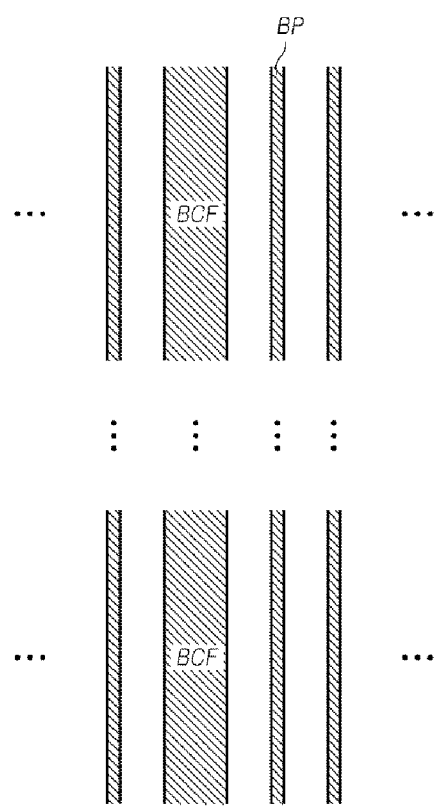
Figure 6:
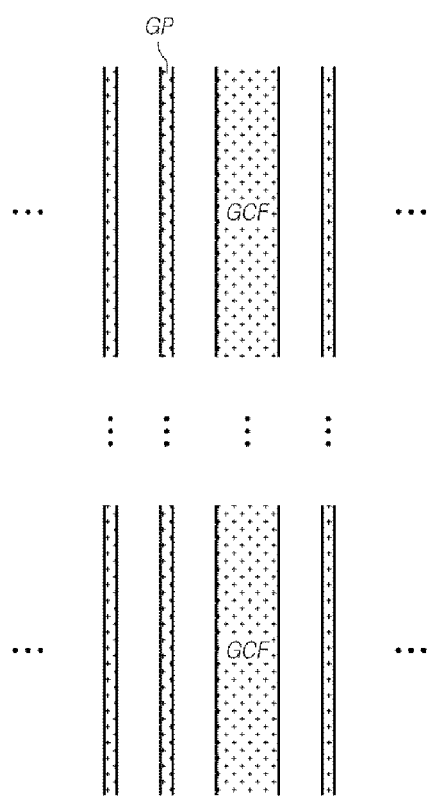

FIG. 3 is a diagram illustrating a structure of a display panel of an organic light emitting display device according to an embodiment of the present invention. FIGS. 4 to 6 are diagrams illustrating a structure of a color filter layer disposed in an organic light emitting display device and a color pattern of a corresponding color filter layer. FIGS. 7 to 9 are diagrams illustrating a structure of a color filter layer and a control pattern thereof in an area A and an area C of FIG. 3.

Here, the descriptions will be provided from the perspective of an organic light emitting display device that has: an array substrate including an OLED equipped with a white (W) organic light emitting layer that emits white (W) light; and a color filter substrate including color filter layers (RCF, WCF, BCF, and GCF) corresponding to sub-pixels (SP), and the shielding layer 300. However, the shielding layer 300 of the present invention may be equally applied to the color filter substrate of a liquid display device that uses a black matrix (BM).

Referring to FIGS. 3 to 9, the display panel 110 of the organic light emitting display device 100 of the present invention may include a display area (Active Area (A/A)) in which sub-pixels (SP) are disposed in a matrix form and a non-display area (Non Active Area (N/A)) disposed in the circumference of the display area (A/A).

In the display area (A/A), a plurality of pixels are disposed, each pixel being formed of red (R), white (W), blue (B), and green (G) sub-pixels. In the drawing, the sub-pixels are disposed in the order of R, W, B, and G. However, the order is not fixed, and thus, the sub-pixels may be disposed in various orders, such as, the order of B, W, R, and G.

In the organic light emitting display device 100 according to an embodiment of the present invention, an organic light emitting diode (OLED) including a white (W) organic light emitting layer that emits white (W) light may be disposed in each sub-pixel.

Therefore, each sub-pixel of the organic light emitting display device of the present invention includes an emission area (EA) where an OLED is disposed and a non emission area (NEA) where a transistor (a driving transistor, a switching transistor, a gate line, a data line, a voltage line, or the like) or the like is disposed.

Also, the organic light emitting display device may include a color filter substrate that is equipped with R, W, B, and G color filter layers (RCF, WCF, BCF and GCF) corresponding to the emission areas (EA) of the sub-pixels (SP), and the shielding layer 300 corresponding to non emission areas (NEA) between the sub-pixels.

The shielding layer 300 may be formed by layering R, B, and G color patterns (RP, BP, and GP) which are formed together with the R, B, and G color filters layers (RCF, BCF, GCF) out of the color filter layers. Therefore, the present invention may remove a black matrix (BM) that has been used for a conventional display device, and may layer color patterns so as to form the optical shielding layer 300 that acts as a black matrix, thereby simplifying a production process.

Referring to FIGS. 4, 5 and 6, the R, B, and G color filter layers (RCF, BCF and GCF) may be provided in stripes formed from the top to the bottom of the display panel 110. In this instance, R, B, and G color patterns (RP, BP, and GP) are formed, simultaneously, in an area corresponding to the non emission areas (NEA) of sub-pixels (SP).

As illustrated in FIG. 4, a R color filter layer (RCF) is formed in a stripe shape to correspond to the column of the R sub-pixels, and a R color pattern (RP) is formed, which is disposed between a W sub-pixel (SP) and a B sub-pixel (SP), and between the B sub-pixel and the G sub-pixel. The R color pattern (RP) may be disposed to be parallel with the R color filter layer (RCF).

Referring to FIGS. 5 and 6, the B color filter layer (BCF) and the G color filter layer (GCF) are formed in stripes to correspond to the column of B sub-pixels and the column of G sub-pixels. B color pattern (BP) and G color pattern (GP) are formed in stripes in areas between adjacent sub-pixels (SP). The B color pattern (BP) and the G color pattern (GP) are disposed to be parallel to the B color filter layer (BCF) and the G color filter layer (GCF), respectively.

Therefore, the organic light emitting display device 100 of the present invention may not separately form a black matrix (BM), but may form the shielding layer 300 by layering the R, B, and G color patterns (RP, BP, and GP) when R, B, and G color filter layers (RCF, BCF and GCF) are formed.

Referring back to FIG. 3, the shielding layer 300 of the present invention may include: an optical shielding unit 312 where R, B, and G color patterns (RP, BP, and GP) are disposed along with a corresponding column of sub-pixels (SP); and a first connection pattern unit 310 and a second connection pattern unit 311 which are disposed in both edges of the shielding unit 312 and are connected for each color filter layer.

As the resolution of the display device becomes higher, the interval between sub-pixels (SP) becomes narrower, and thus, the distance between sub-pixels may have a width of about 10 μm or smaller. Subsequently, the width of the optical shielding unit 312 that is disposed in the optical shielding layer 300 of the organic light emitting display device 100 of the present invention may have a width of approximately 10 μm.

In other words, the widths of each of the R, B, and G color patterns (RP, CP, and GP) forming the optical shielding unit 312 may be formed to be approximately 10 μm.

As described above, the widths of the R, B, and G color patterns (RP, BP, and GP) forming the optical shielding unit 312 are significantly small, and thus, the R, B, and G color patterns (RP, BP, and GP) may be damaged by being lost or broken during a production process.

That is, the R, B, and G color filter layers (RCF, BCF, and GCF) correspond to widths of sub-pixels (SP), and the widths are greater than the R, B, and G color patterns (RP, BP, and GP), and thus, loss or breaking does not occur during the process. However, the widths of the color patterns (RP, BP, and GP) are narrow and may thus be frequently lost or broken during the production process.

As described above, to prevent the R, B, and G color patterns (RP, BP, and GP) from being lost and broken, the organic light emitting display device 100 of the present invention may form the first and second connection pattern units 310 and 311 in the shielding layer 300.

The first connection pattern unit 310 is formed in a structure in which a first red connection pattern (RCP1), a first blue connection pattern (BCP1), and a first green connection pattern (GCP1) are layered. The second connection pattern unit 311 is formed in a structure in which a second red connection pattern (RCP2), a second blue connection pattern (BCP2), and a second green connection pattern (GCP2) are layered.

Figure 7A:
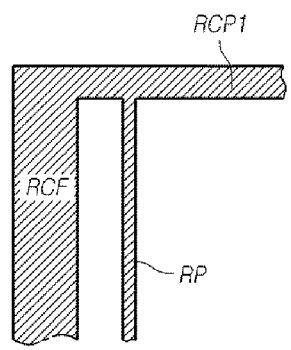
FIGS. 7A to 9B are diagrams illustrating a structure of a color filter layer and a color pattern thereof in area A and area C of FIG. 3.
Figure 7B:
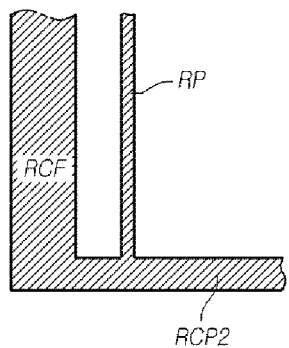

Referring to FIGS. 7A and 7B, when a red color filter layer (RCF) and a red color pattern (RP) are formed in the present invention, the present invention may form the first red connection pattern (RCP1) and the second red connection pattern (RCP2), which are formed to be integrated with the red color filter layer (RCF) and the red color patter (RP), in the upper and lower edges (a boundary area between the display area and the non-display area) of the red color filter layer (RCF) and the red color pattern (RP).

That is, the first red connection pattern (RCP1) and the second red connection pattern (RCP2) are connected with both edges of the red color filter layer (RCF) and the red color pattern (RP), and thus, the red color filter layer (RCF) and the red color pattern (RP) are prevented from being lost or broken during the production process.

Figure 8A:
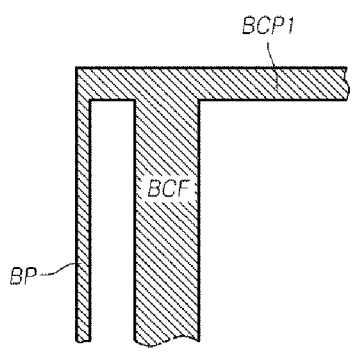
Figure 8B:
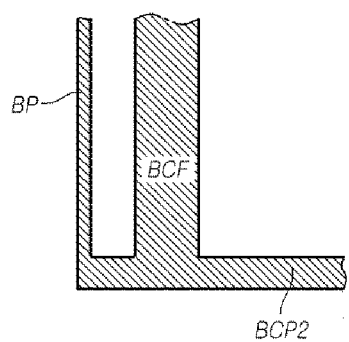

Referring to FIGS. 8A and 8B, when a blue color filter layer (BCF) and a blue color pattern (BP) are formed, the present invention may form a blue connection pattern (BCP1) and a second blue connection pattern (BCP2), which are formed to be integrated with the blue color filter layer (BCF) and the blue color pattern (BP), in the upper and lower edges (a boundary area between the display area and the non-display area) of the blue color filter layer (BCF) and the blue color pattern (BP).

That is, the first blue connection pattern (BCP1) and the second blue connection pattern (BCP2) are connected with both edges of the blue color filter layer (BCF) and the blue color pattern (BP), and thus, the blue color filter layer (BCF) and the blue color pattern (BP) are prevented from being lost or broken during the process.

Figure 9A:
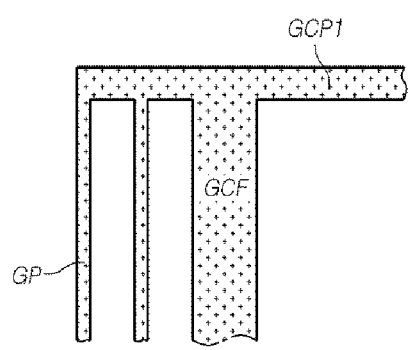
Figure 9B:
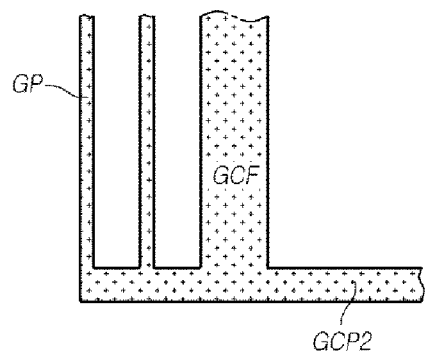

Referring to FIGS. 9A and 9B, when a green color filter layer (GCF) and a green color pattern (GP) are formed, the present invention may form a first green connection pattern (GCP1) and a second green connection pattern (GCP2), which are formed to be integrated with the green color filter layer (GCF) and the green color pattern (GP), in the upper and lower edge areas (the boundary area between the display area and the non-display area) of the green color filter layer (GCF) and the green color pattern (GP).

That is, the first green connection pattern (GCP1) and the second green connection pattern (GCP2) are connected with the both edges of the green color filter layer (GCF) and the green color pattern (GP), and thus, the green color filter layer (GCF) and the green color pattern (GP) are prevented from being lost or broken during the process.

Also, the width of the first connection pattern unit 310 of the shielding layer 300 is formed to be approximately 30 μm, and thus, the widths of the first red connection pattern (RCP1), the first blue connection pattern (BCP1), and the first green connection pattern (GCP1) are formed to be approximately 30 μm.

In the same manner, the width of the second connection pattern unit 311 is formed to be approximately 30 μm, and thus, the widths of the second red connection pattern (RCP2), the second blue connection pattern (BCP2), and the second green connection pattern (GCP2) are formed to be approximately 30 μm.

Although the structures of the first and second connection pattern units 310 and 311 have been illustrated from the perspective of the area A and the area C of the display panel 110, R, B, and G connection patterns are formed to be integrated with color filter layers and color patterns in the same manner in an area B and an area D.

As described above, a color filter substrate and a display device having the same, according to an embodiment of the present invention, may simplify a production process by forming a shielding layer that is formed of R, B, and G color patterns, when R, B, and G color filter layers are formed.

Also, a color filter substrate and a display device having the same, according to an embodiment of the present invention, may prevent color filter layers or color patterns from being lost or broken during a process, by forming connection patterns in the edges of R, B, and G color filter layers and R, B, and G color patterns which are simultaneously formed with the color filter layers.

Also, a color filter substrate and a display device having the same, according to an embodiment of the present invention, may prevent the damage of color patterns during a production process by forming connection patterns that connect the color patterns or increase the widths of the color patterns of a shielding layer disposed in the non emission areas of sub-pixels.

Figure 10:
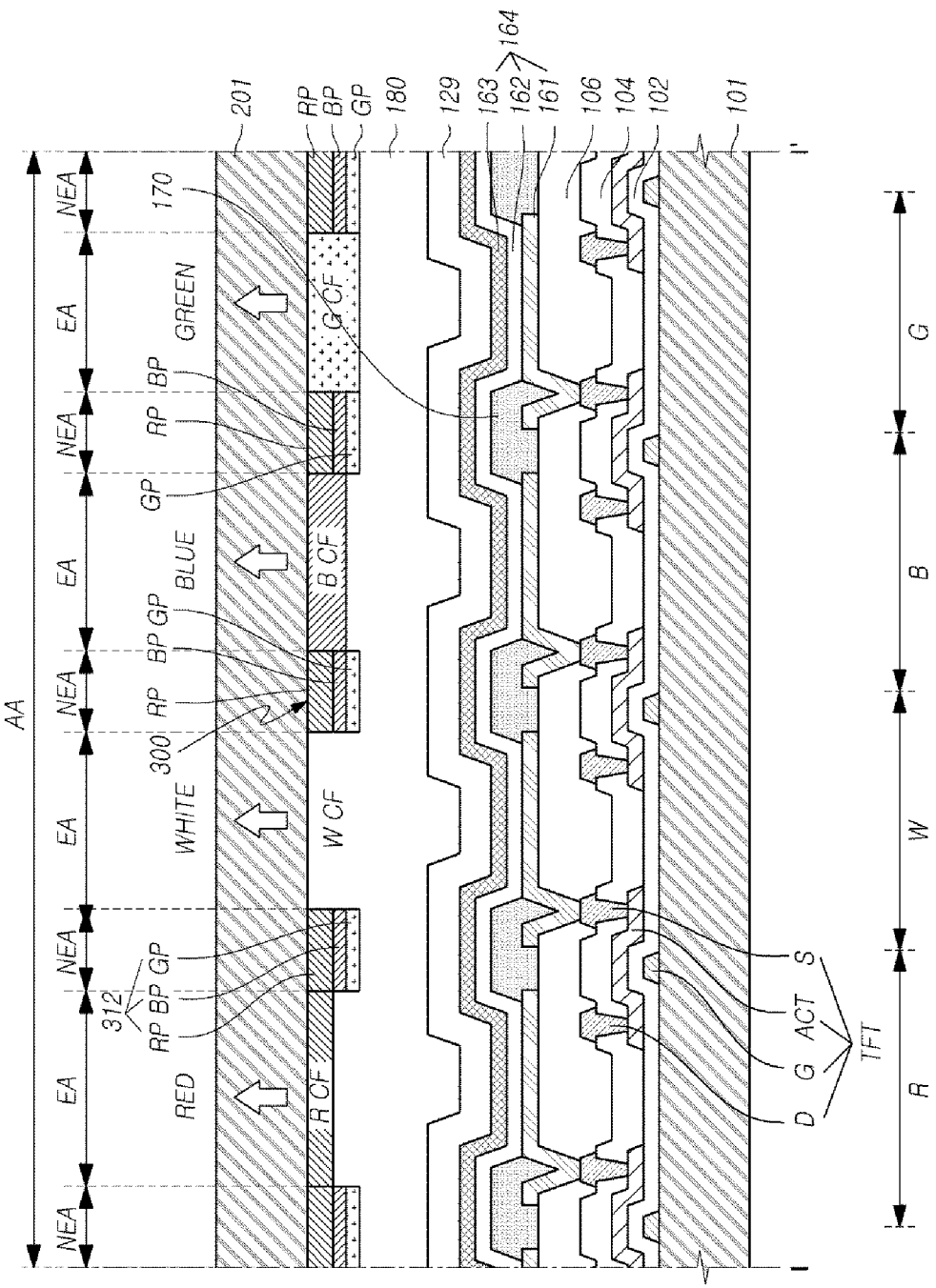
FIG. 10 is a sectional view that is cut along a line I-I' of FIG. 3.
Figure 11:
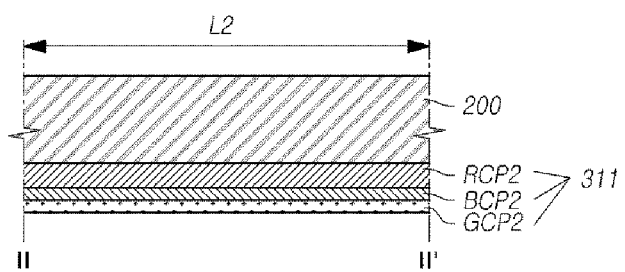
FIG. 11 is a sectional view that is cut along a line II-II' of FIG. 3.
Figure 12:
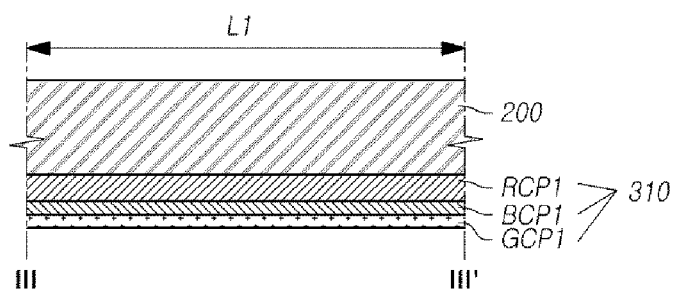
FIG. 12 is a sectional view that is cut along a line III-III' of FIG. 3.
Figure 13:
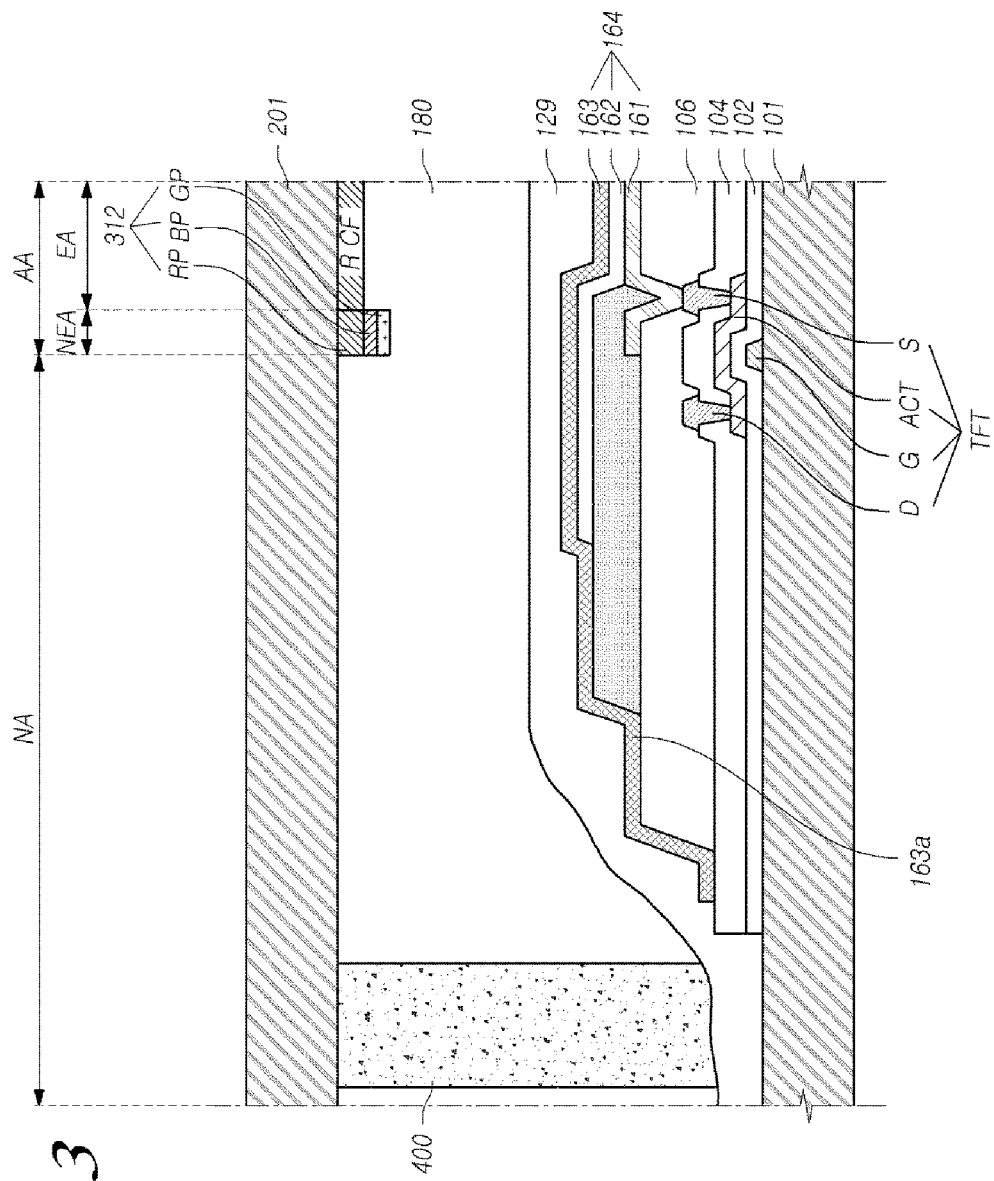
FIG. 13 is a sectional view of a boundary between a display area and a non-display area of an organic light emitting display device according to an embodiment of the present invention.

FIG. 10 is a sectional view cut along a line I-I' of FIG. 3. FIG. 11 is a sectional view cut along a line II-II' of FIG. 3. FIG. 12 is a sectional view cut along a line III-III' of FIG. 3. FIG. 13 is a sectional view of a boundary area between a display area and a non-display area of an organic light emitting display device of the present invention.

As illustrated in FIG. 10, the display panel 110 of the organic light emitting display device 100 of the present invention includes a display area (AA) and a non-display area (BA) that is disposed along the circumference of the display area (AA). The display panel 110 may have a structure in which a color filter substrate having color filter layers, and an array substrate including the OLED 164, a driving transistor (TFT), and related layers, are coadunate by including an encapsulation layer 180 therebetween.

In the array substrate of the organic light emitting display device, a first substrate 101 in which red (R), white (W), blue (B), and green (G) sub-pixels are arranged; a driving transistor (Thin Film Transistor (TFT) disposed in each sub-pixel; and an organic light emitting diode (OLED) 164 that is disposed on the TFT and is formed of a first electrode 161 (a pixel electrode), the organic light emitting layer 162 and a second electrode 163 (a common electrode) are disposed.

The driving transistor (TFT) includes a gate electrode (G), a gate insulator film 102, an active layer (ACT), an interlayer insulation layer 104, a drain electrode (D), and a source electrode (S). The organic light emitting diode 164 may be disposed on the driving transistor (TFT), by including a planarization film 106 therebetween. The layer 129, which is illustrated in the drawing, is a protection film, and may be formed on the front of the first substrate 101 and may protect a device formed on the array substrate.

The color filter substrate of the organic light emitting display device includes: a second substrate 201; R, W, B, and G color filter layers (RCF, WCF, BCF and GCF) disposed in an area corresponding to emission areas (EA) of sub-pixels (SP); and the shielding unit 312 disposed in an area corresponding to non-emission areas (NEA) of sub-pixels (SP).

The shielding layer 300 is disposed in the color filter substrate of the present invention, which designates sub-pixels and shields light. The optical shielding unit 312 of the optical shielding layer 300 may be formed in stripes, as illustrated in FIG. 3.

The optical shielding unit 312 may include a red color pattern (RP) that is formed when a red color filter layer (RCF) is formed, a blue color pattern (BP) that is formed when a blue color filter layer (BCF) is formed, and a green color pattern (GP) that is formed when a green color filter layer (GCF) is formed.

That is, the optical shielding unit 312 may be formed by layering a red color pattern (RP), a blue color patter (BP), and a green color pattern (GP), and may shield light that is incident from the outside or light that is emitted from the inside. Therefore, when the color filter substrate is formed in the organic light emitting display device of the present invention, an optical shielding layer is formed in parallel with forming color filter layers without a separate process for forming the optical shielding layer, and thus, a production process is simplified.

Also, referring to FIGS. 11 and 12, in association with the optical shielding layer 300 disposed in the organic light emitting display device 100 of the present invention, the first connection pattern unit 310 and the second connection pattern unit 311 are disposed respectively in the upper portion and the lower portion of the display panel 110.

The second connection pattern unit 311 is formed in a structure in which a second red connection pattern (RCP2) which is formed in parallel with a red color filter layer (RCF); a second blue connection pattern (BCP2) which is formed in parallel with a blue color filter layer (BCF); and a second green connection pattern (GCP2) which is formed in parallel with a green color filter layer (GCF), are layered.

The width (L2) of the second connection pattern unit 311 may be formed to be approximately 30 μm. Therefore, the widths of the second red connection pattern (RCP2), the second blue connection pattern (BCP2), and the second green connection pattern (GCP2), which form the second connection pattern unit 311, may be formed to be approximately 30 μm.

In the same manner, the width (L1) of the first connection pattern unit 310 may be formed to be approximately 30 μm. Therefore, the first connection pattern unit 310 is formed in a structure in which a first red connection pattern (RCP1), a first blue connection pattern (BCP1), and a first green connection pattern (GCP1) are layered, and the widths of the first connection patterns (RCP1, RCP2, and RCP3) may be formed to be approximately 30 μm.

Although it is described that the widths (L1 and L2) of the first and second connection pattern units 310 and 311 are approximately 30 μm, this may be variously enlarged or reduced based on the size of the organic light emitting display device or the margin of the non-display area (NA).

Therefore, the first and second connection pattern units 310 and 311 are formed by layering the red, blue, and green connection patterns, so as to act as an optical shielding layer, and may be formed to be integrated with the color filter layers and color patterns, and thus, may prevent the color filter layers and the color patterns from being lost or broken.

Referring to FIG. 13, in the organic light emitting display device 100 of the present invention, a color filter substrate, and an array substrate are coadunate by a seal line 400, and the shielding unit 312 is disposed in the edge of the display area (AA) of the display panel 110, that is, the boundary of the display area AA and the non-display area (NA).

The shielding unit 312 is formed in a structure in which a red color pattern (RP) formed to be integrated with the red color filter layer (RCF) disposed in the edge of the display area (AA) is layered, and the blue color pattern (BP) and the green color pattern (GP) are layered on the red color pattern (RP).

Sub-pixels (SP) where the red, blue, and green color filter layers (RCF, BCF and GCF) are respectively formed may include non-emission areas, and thus, the color filter layers may include color patterns (RP, BP, and GP) of which parts are extended to the non emission areas.

As illustrated in FIG. 13, the red color pattern (RP) includes a red color pattern (RP) that is extended to non-emission areas (NEA) in both edges of the red color filter layer (R-CF).

The optical shielding unit 312 may be formed by layering the blue color pattern (BP) and the green color pattern (GP) on the red color pattern (RP).

As described above, in association with the optical shielding layer 300 disposed in the organic light emitting display device 100 of the present invention, the red color filter layer (RCF), the red color pattern (RP), the first red connection pattern (RCP1), and the second red connection pattern (RCP2) are formed to be integrated with one another, and thus, loss or breaking may be prevented during a process.

In the same manner, the blue color filter layer (BCF), the blue color pattern (BP), the first blue connection pattern (BCP1), and the second blue connection pattern (BCP2) are formed to be integrated with one another, and the green color filter layer (GCF), the green color pattern (GP), the first green connection pattern (GCP1), and the second green connection pattern (GCP2) are formed to be integrated with one another, and thus, loss or breaking may be prevented during a process.

As described above, a color filter substrate and a display device having the same according to an embodiment of the present invention simplifies a production process by forming a shielding layer that is formed of red (R), blue (B), and green (G) color patterns when the red (R), blue (B), and green (G) color filter layers are formed.

Also, a color filter substrate and a display device having the same, according to an embodiment of the present invention, prevents color filter layers or color patterns from being lost or broken during a process, by forming connection patterns in the edges of R, B, and G color filter layers and R, B, and G color patterns which are formed simultaneously with the color filter layers.

Also, a color filter substrate and a display device having the same, according to an embodiment of the present invention, may prevent the damage of color patterns during a production process by forming connection patterns that connect the color patterns or increase the width of the color patterns of a shielding layer disposed in the non emission area of sub-pixels.

Figure 14A:
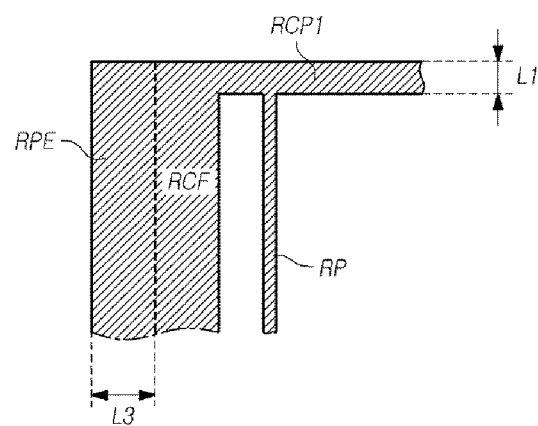
FIGS. 14A to 16B are diagrams illustrating a structure of a color filter layer And a color pattern thereof in area A and area C of FIG. 3, according to another embodiment of the present invention.
Figure 14B:
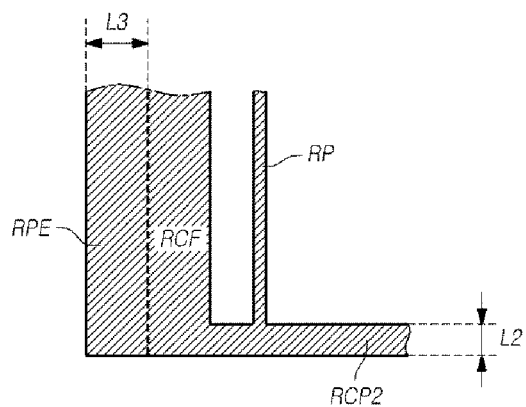
Figure 15A:
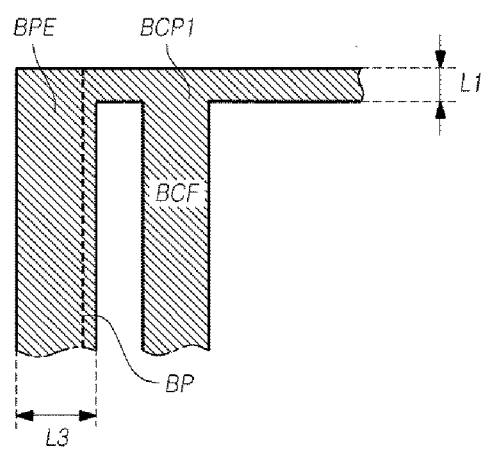
Figure 15B:
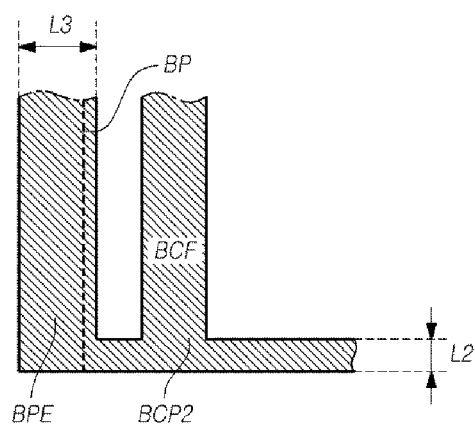
Figure 16A:
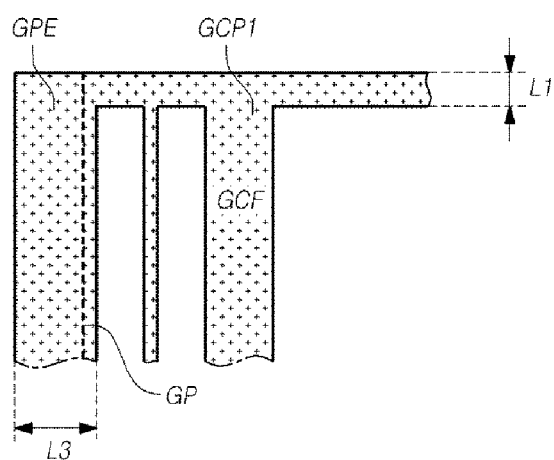
Figure 16B:
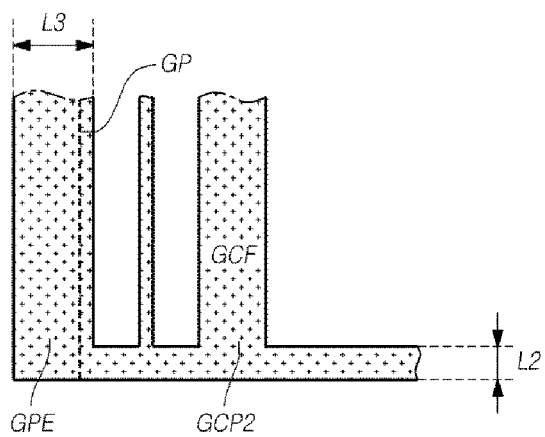
Figure 17:
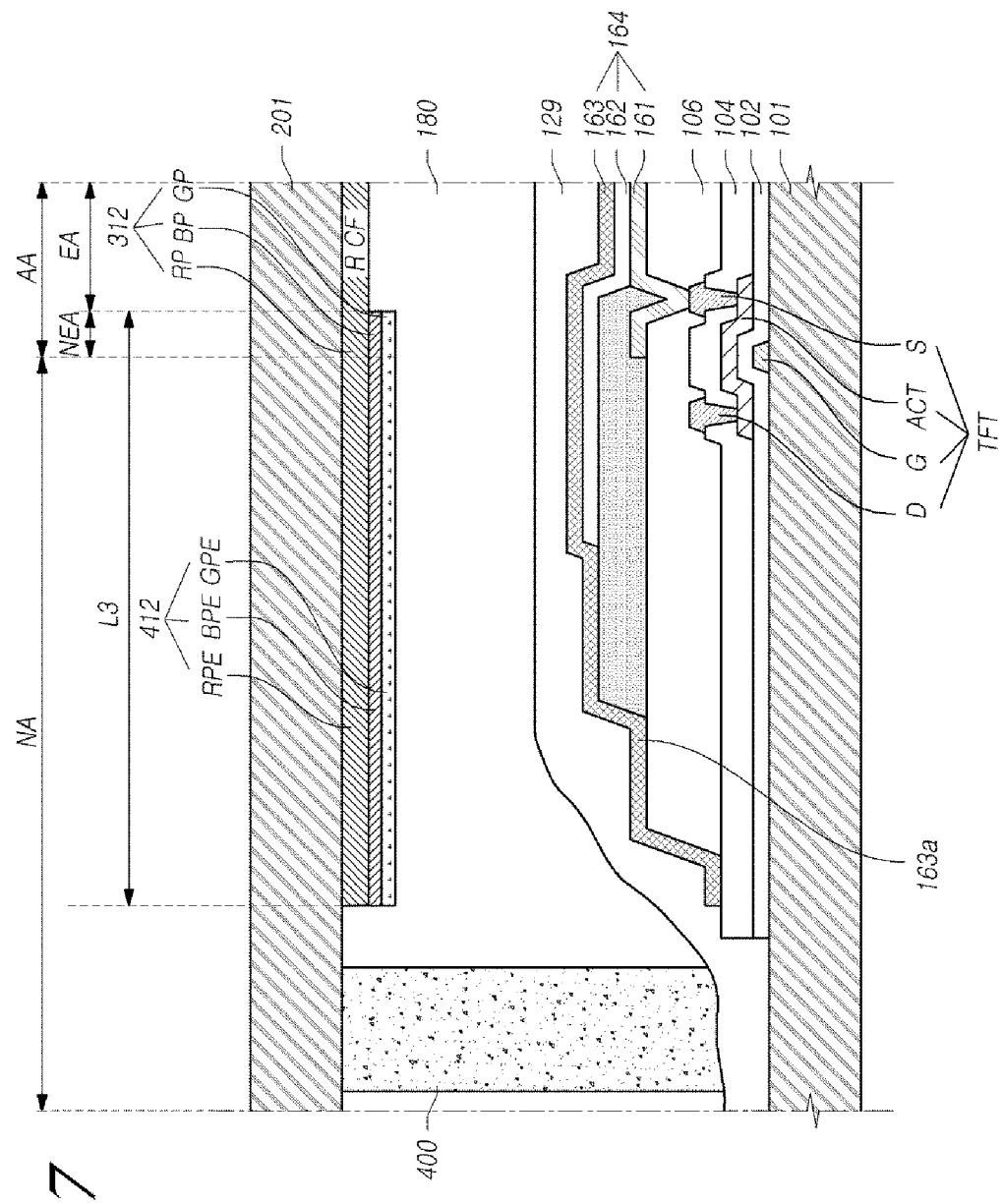
FIG. 17 is a sectional view at a boundary between a display area and a non-display area of an organic light emitting display device according to another embodiment of the present invention.

FIGS. 14 to 16 are diagrams illustrating a structure of a color filter layer and a color pattern thereof in an area A and an area C of FIG. 3 according to another embodiment of the present invention. FIG. 17 is a sectional view of a boundary between a display area and a non-display area of an organic light emitting display according to another embodiment of the present invention.

Referring to FIGS. 14A and 14B, when forming a red color filter layer (RCF) and a red color pattern (RP), an organic light emitting display device according to another embodiment of the present invention may form a first red connection pattern (RCP1) and a second red connection pattern (RCP2), which are formed to be integrated with the red color filter layer (RCF) and the red color patter (RP), in the upper and lower edge areas of the red color filter layer (RCF) and the red color pattern (RP) (the boundary area of the display area and the non-display area).

In addition, a red extension unit (RPE) may be formed in an area that corresponds to the boundary between the display area (AA) and the non-display area (NA) of the display panel 110. That is, a RPE of width (L3) may be formed that is perpendicular to the first and second red connection patterns (RCP1 and RCP2) and is parallel with the shielding unit 312.

Referring to FIG. 17, the red extension unit (RPE) is formed to be extended from the red color filter layer (RCF) to an area corresponding to the non-emission area (NEA) of a sub-pixel, which is the edge of the display area (AA), and an extension unit 163a of the second electrode 163 of the non-display area (NA).

As such, the red extension unit (RPE) is extended to the area corresponding to the extension unit 163a of the second electrode 163, from the red color pattern (RP) that is located in the boundary of the display area (AA), and is formed to be integrated with the red color filter layer (RCF).

Also, the red extension unit (RPE) may be formed to be integrated with the first red connection pattern (RCP1) and the second red connection pattern (RCP2), in the upper portion and the lower portion of the display panel 110. As illustrated in FIGS. 14A and 14B, the red extension unit (RPE) is formed to be integrated with the red color filter layer (RCF) since a red (R) sub-pixel (SP) is located in the edge of the display area (AA). Referring to FIGS. 15A to 16B, when a blue (B) or green (G) sub-pixel is located away from the edge, a blue (BPE) or green (GPE) extension unit may be formed to be integrated with a corresponding color pattern (a BP or GP).

Referring to FIG. 17, an optical shielding extension unit 412 may be formed by layering a blue extension unit (BPE) and a green extension unit (GPE) on the red extension unit (RPE). The blue extension unit (BPE) may be formed to be integrated with a first blue connection pattern (BCP1), a second blue connection pattern (BCP2), and a blue (B) color pattern (BP). The green extension unit (GPE) may be formed to be integrated with a first green connection pattern (GCP1), a second green connection pattern (GCP2), and a green color pattern (GP).

The optical shielding extension unit 412 may be formed in both edges of the display panel 110, that is, areas excluding edges where the first and second connection pattern units 310 and 311 are disposed.

Therefore, the optical shielding extension unit 412 may be formed to face each other by including the display area AA therebetween, and the first connection pattern unit 310 and the second connection pattern unit 311 and the optical shielding extension unit 412 form a quadrangular shape.

The optical shielding extension unit 412 may be disposed to be parallel with the optical shielding unit 312, and a second electrode of the OLED 164 disposed in the array substrate, that is, an upper electrode, may correspond to the optical shielding unit 412 in an area that is extended to the non-display area outside the display area (AA). That is, the width (L3) of the optical shielding extension unit 412 may be determined to enable the upper electrode of the OLED 164 and the optical shielding extension unit 412 to correspond in the non-display area.

Therefore, the optical shielding extension unit 412 may have a width (L3) which is greater than, or equal to, 1 mm from the edge of a sub-pixel (SP) that is formed in the edge of the display area (AA), and thus, may prevent the color filter layers and color patterns from being lost or broken, together with the first and second connection pattern units 310 and 311.

Figure 18:
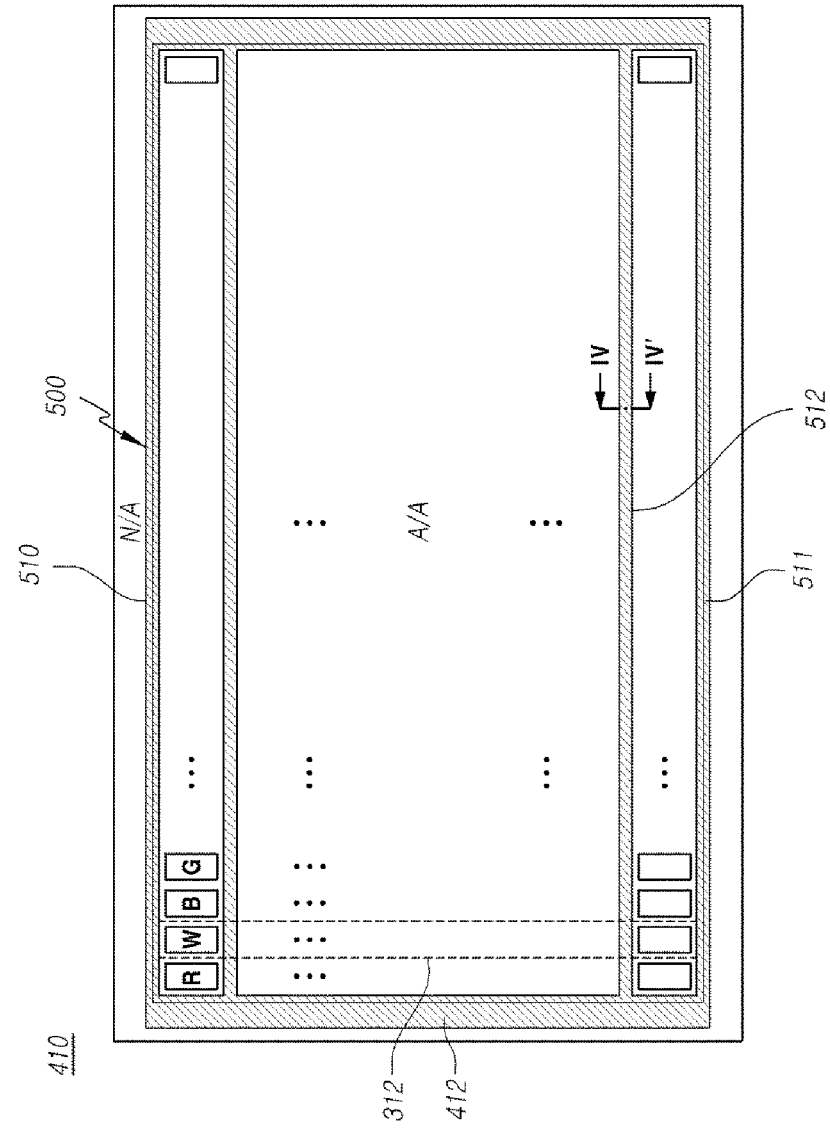
FIG. 18 is a diagram illustrating a structure of a color filter layer and a color pattern of an organic light emitting display device according to another embodiment of the present invention.
Figure 19:
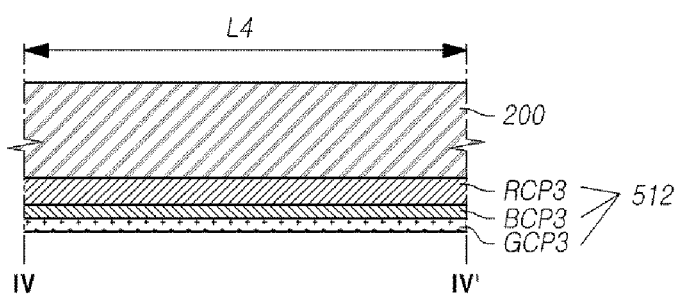
FIG. 19 is a sectional view that is cut along a line IV-IV' associated with a third connection pattern unit of FIG. 18.
Figure 20A:
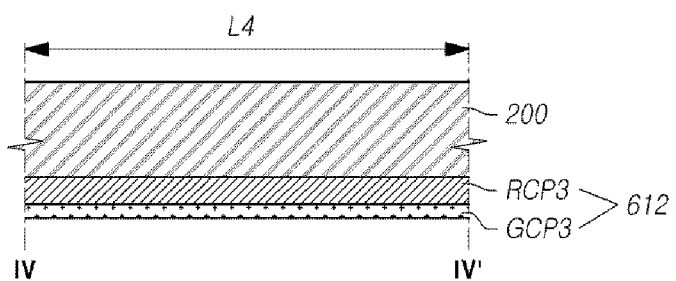
FIGS. 20A to 20C are diagrams illustrating various examples of the third connection pattern unit of FIG. 18.
Figure 20B:
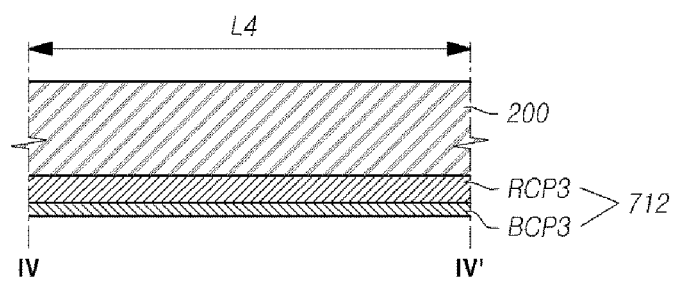
Figure 20C:
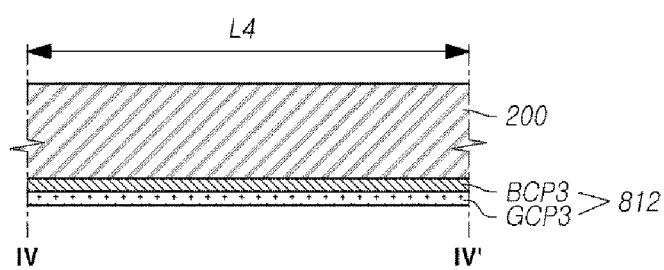
Figure 21:
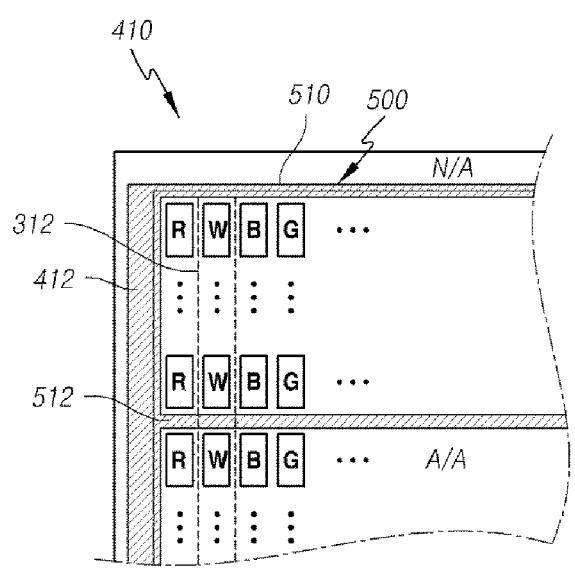
FIG. 21 is a diagram illustrating a structure of an organic light emitting display device according to another embodiment of the present invention.

FIG. 18 is a diagram illustrating a structure of a color filter layer and a color pattern of an organic light emitting display device according to another embodiment of the present invention. FIG. 19 is a sectional view cut along a line IV-IV' of the third connection pattern unit. FIGS. 20A to 20C are diagrams illustrating various examples of the third connection pattern unit of FIG. 18. FIG. 21 is a diagram illustrating a structure of an organic light emitting display device according to a further embodiment of the present invention.

Referring to FIG. 18, the organic light emitting display device 100, according to the another embodiment of the present invention, may include: a display panel 410 including a display area (AA) and a non-display area (N/A); and an optical shielding layer 500, which includes a first connection pattern unit 510 and a second connection pattern unit 511 disposed along the circumference of the display area (AA), an optical shielding extension unit 412 disposed between the first and the second connection pattern units 510 and 511, the optical shielding unit 312 disposed between columns of sub-pixels, and a third connection pattern unit 512 that intersects the optical shielding extension unit 412 and the optical shielding unit 312.

Referring to FIG. 19, the third connection pattern unit 512 is formed by layering a third red connection pattern (RCP3); a third blue connection pattern (BCP3) disposed on the third red connection pattern (RCP3); and a third green connection pattern (GCP3) disposed on the third blue connection pattern (BCP3).

The third red connection pattern (RCP3) is formed to be integrated with a red color filter layer (RCF) and a red color pattern (RP), in the same manner as the first and a second red connection patterns (RCP1 and RCP2).

The third blue connection pattern (BCP3) is formed to be integrated with a blue color filter layer (BCF) and a blue color pattern (BP), in the same manner as the first and the second blue connection patterns (BCP1 and BCP2).

The third green connection pattern (GCP3) is formed to be integrated with a green color filter layer (GCF) and a green color pattern (GP), in the same manner as the first and the second green connection patterns (GCP1 and GCP2).

The third connection pattern unit 512 is disposed between rows of sub-pixels, which are disposed in the horizontal direction. The third connection pattern unit 512 may be selectively disposed based on a sub-pixel row unit or at least two or more row units. That is, the third connection pattern unit 512 may be selectively disposed between sub-pixels provided in the vertical direction (the column direction that is perpendicular to the row direction) or between at least two or more sub-pixels provided in the vertical direction, as illustrated in FIG. 21.

In FIG. 21, the third connection pattern unit 512 is selectively disposed, in a display area (AA), based on two or more row units. The third connection pattern unit 512 is used to prevent color filter layers and color patterns from being lost or broken, and to remove a bluish, greenish, and reddish defect, which is to be described in the following descriptions, and thus, the third connection pattern unit 512 may be disposed in multiple pieces based on two sub-pixel row units, three or more sub-pixel row units, or a combination thereof.

Referring to FIG. 19, the width (L4) of the third connection pattern unit 512 is greater than, or equal to, 30 µm, and may be formed in various widths within a range from the upper edge of the emission area (EA) of a sub-pixel (SP) corresponding to at least a row to the lower edge of the emission area (EA) of a sub-pixel (SP) corresponding to adjacent row.

That is, the width (L4) of the third connection pattern unit 512 may be formed in a range from 30 µm to a width corresponding to a width of a non-emission area (NEA) between sub-pixels provided in the vertical direction.

FIGS. 20A to 20C illustrate another embodiment of the present invention. When a bluish, greenish, or reddish defect occurs in a sub-pixel row corresponding to the third connection pattern unit 512, particularly, when a bluish, greenish, or reddish defect occurs in a white (W) sub-pixel, the third connection pattern unit 512 of FIG. 19 may be formed by deleting a connection pattern of a predetermined color.

FIGS. 20A to 20C illustrate third connection pattern units 612, 712, and 812 having different structures. These may be equally applied to the structure of the third connection pattern unit 512 of FIG. 21.

For example, referring to FIG. 20A, when a bluish defect occurs in white (W) sub-pixels out of the sub-pixels (SP) arranged in the horizontal direction, the structure of the third connection pattern unit 612 may be formed by layering the third red connection pattern (RCP3) and the third green connection pattern (GCP3).

Also, referring to FIG. 20B, when a greenish defect occurs in white (W) sub-pixels out of the sub-pixels (SP) arranged in the horizontal direction, the structure of the third connection pattern unit 712 may be formed by layering the third red connection pattern (RCP3) and the third blue connection pattern (BCP3). Referring to FIG. 20C, when a reddish defect occurs, the structure of the third connection pattern unit 812 may be formed by layering the third blue connection pattern (BCP3) and the third green connection pattern (GCP3). Also, the third connection pattern unit 512 may be arranged such that a layered structure of red (R), green (G) and Blue (B) third connection patterns is disposed between red (R), green (G) and Blue (B) sub-pixels, whereas two color layers of third connection patterns may be disposed between white (W) sub-pixels.

Also, although the above descriptions are provided from the perspective of the third connection pattern unit, the layer structure of an optical shielding unit that is disposed along the column of sub-pixels may be embodied based on the identical principle by omitting a part of the color patterns so as to remove a bluish, greenish, or reddish defect. For example, the color patterns of the shielding layer may include one of: a red color pattern layered with a green color pattern, a red color pattern layered with a blue color pattern, and a blue color pattern layered with a green color pattern, on either side of a column of white sub-pixels.

Therefore, the organic light emitting display device may change the structure of layer patterns of the optical shielding unit 312 or the third connection pattern unit 512 of the shielding unit 500 along the column or row of sub-pixels of the display panel 410, and thus, may improve the level of image quality.

In addition, although the above descriptions are provided based on color patterns of the optical shielding unit formed as stripes, the structure of the optical shielding unit may be arranged such that pairs of color pattern layers are disposed based on color filters of adjacent sub-pixels. For example, the shielding layer between a blue color filter and a green color filter may be disposed as a layer of a red color pattern and a layer of a green color pattern. In the case of the shielding layer between a red or a blue sub-pixel and a white sub-pixel, the two layers of color patterns may be selected based on bluish, greenish or reddish defect.

In the case of the third connection pattern unit, the structure of the third connection pattern unit may be such that pairs of third connection patterns are arranged based on the color filters of adjacent sub-pixels. For example, the third connection pattern unit between red color filters may include a third blue connection pattern layered with a third green connection pattern. The third connection pattern unit between blue color filters may include a third red connection pattern layered with a third green connection pattern. The third connection pattern unit between green color filters may include a third red connection pattern layered with a third blue connection pattern. In the case of a third connection pattern unit between white sub-pixels, the two layers of third connection patterns may be selected based on bluish, greenish or reddish defect.

Also, although the above descriptions are provided based on color patterns of the optical shielding unit disposed between sub-pixels, the optical shielding unit may be formed between pixels. Similarly, the third connection pattern unit may be disposed between rows of pixels.

Also, the thickness of a color pattern may be disposed to be a different thickness than the respective color filter layer. For example, the thickness of the green color pattern may be disposed to be less thick than the green color filter. The thickness of the blue color pattern may be disposed to be less thick than the blue color filter. Similarly, the thickness of a third connection pattern may be disposed to be a different thickness than the respective color filter layer. For example, the thickness of the third green connection pattern may be disposed to be less thick than the green color filter. The thickness of the third blue connection pattern may be disposed to be less thick than the blue color filter.

As described above, a color filter substrate and a display device having the same, according to an embodiment of the present invention, simplifies a production process by forming a shielding layer that is formed of red (R), blue (B), and green (G) color patterns, when the red (R), blue (B), and green (G) color filter layers are formed.

Also, a color filter substrate and a display device having the same, according to an embodiment of the present invention, prevents color filter layers or color patterns from being lost or broken by forming connection patterns in the edges of R, B, and G color filter layers and R, B, and G color patterns, which are simultaneously formed with the color filter layers.

Also, a color filter substrate and a display device having the same, according to an embodiment of the present invention, may prevent the damage of color patterns during a process by forming connection patterns that connect the color patterns or increase the width of the color patterns of a shielding layer disposed in the NEA of sub-pixels.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A color filter substrate in a display panel, the color filter substrate comprising:
    a substrate configured to include a display area having an area of a plurality of sub-pixels with emission areas and non-emission areas, and a non-display area along the circumference of the display area;
    a color filter layer configured to include a first color filter, a second color filter, and a third color filter, which are disposed in an area corresponding to the sub-pixels and have different colors, wherein the color filter layer is attached to a first color pattern and a second color pattern;
    an optical shielding unit disposed between the sub-pixels, and including the first color pattern overlapping the second color pattern at the non-emission areas; and
    a first connection pattern unit and a second connection pattern unit, which are included in the non-display area, and are configured to connect both ends of the color filter layer and the optical shielding,
    wherein a thickness of a color pattern of the optical shielding unit is less than a thickness of the color filter layer for the respective color.

2. The color filter substrate of claim 1, further comprising:
    an optical shielding extension unit disposed in both ends of the first and second connection pattern units, and being parallel with the optical shielding unit.

3. The color filter substrate of claim 2, wherein a width of a short side of the optical shielding extension unit is wider than widths of short sides of the first and second connection pattern units.

4. The color filter substrate of claim 2, wherein the optical shielding unit and the optical shielding extension unit are configured to include the first, the second, and third color filters, which are layered therein.

5. The color filter substrate of claim 4, wherein the first and second connection pattern units are configured to include a red connection pattern, a blue connection pattern, and a green connection pattern, which are layered therein and are formed to be respectively integrated with the first, second, and third color filters.

6. The color filter substrate of claim 1, further comprising:
    a third connection pattern unit in the display area, which is parallel with the first and second connection pattern units and intersects the optical shielding unit.

7. The color filter substrate of claim 6, wherein the first and second connection pattern units and the third connection pattern unit are formed as two layers of the color filters.

8. The color filter substrate of claim 1, wherein the display panel includes a white sub-pixel, and an array substrate having an organic light emitting diode that generates white light.

9. The color filter substrate of claim 1, wherein the first connection pattern unit and the second connection pattern unit are included in a boundary area of the display area in the non-display area.

10. The color filter substrate of claim 1, wherein the optical shielding unit comprises the same material as that of at least one of the first to third color filters; or the optical shielding unit is formed of the same material as that of at least one of the first to third color filters; or the optical shielding unit is formed simultaneously with at least one of the first to third color filters.

11. The color filter substrate of claim 1, wherein a width of each of the first connection pattern unit and the second connection pattern unit is greater than a width of the optical shielding unit.

12. A display device, comprising:
    a lower substrate configured to include a display area having an area of a plurality of sub-pixels with emission areas and non-emission areas, and a non-display area along the circumference of the display area;
    a driving transistor disposed on the lower substrate;
    a pixel electrode disposed on the driving transistor;
    a common electrode disposed on the pixel electrode; and
    a color filter substrate configured to include:

a color filter layer disposed in an area corresponding to the sub-pixels and attached to a first color pattern and a second color pattern;

an optical shielding unit disposed between the sub-pixels and including the first color pattern overlapping the second color pattern at the non-emission areas; and a first connection pattern unit and a second connection pattern unit disposed in edges of the color filter layer and the optical shielding, wherein a thickness of a color pattern of the optical shielding unit is less than a thickness of the color filter layer for the respective color.

13. The display device of claim 12, further comprising:
an optical shielding extension unit disposed in both ends of the first and second connection pattern units, and being parallel with the optical shielding unit.

14. The display device of claim 13, wherein a width of a short side of the optical shielding extension unit is wider than widths of short sides of the first and second connection pattern units.

15. The display device of claim 13, wherein the optical shielding unit and the optical shielding extension unit are configured to include first, second, and third color filters that are layered therein.

16. The display device of claim 15, wherein the first and second connection pattern units are configured to include a red connection pattern, a blue connection pattern, and a green connection pattern, which are layered therein and are formed to be respectively integrated with the first, second, and third color filters.

17. The display device of claim 12, further comprising:
a third connection pattern unit in the display area, which is parallel with the first and second connection pattern units, and intersects the optical shielding unit.

18. The display device of claim 17, wherein the first and second connection pattern units and the third connection pattern unit are formed as two layers among the first, second, and third color filters.

19. The display device of claim 13, wherein the optical shielding extension unit has a width corresponding to an edge area of the common electrode.

20. The color filter substrate of claim 1, wherein the first and second color patterns are interposed between the first and second color filters at the non-emission areas.

21. A color filter substrate in a display panel, the color filter substrate comprising:
a substrate configured to include a display area having an area of a plurality of sub-pixels with emission areas and non-emission areas, and a non-display area along the circumference of the display area;

a color filter layer configured to include a first color filter, a second color filter, and a third color filter, which are disposed in an area corresponding to the sub-pixels and have different colors, wherein the color filter layer is attached to a first color pattern and a second color pattern;

an optical shielding unit disposed between the sub-pixels, and including the first color pattern overlapping the second color pattern at the non-emission areas;

a first connection pattern unit and a second connection pattern unit, which are included in the non-display area, and are configured to connect both ends of the color filter layer and the optical shielding unit; and an optical shielding extension unit disposed in both ends of the first and second connection pattern units, and being parallel with the optical shielding unit, wherein the optical shielding unit and the optical shielding extension unit are configured to include the first, the second, and third color filters, which are layered therein, and wherein the first and second connection pattern units are configured to include a red connection pattern, a blue connection pattern, and a green connection pattern, which are layered therein and are formed to be respectively integrated with the first, second, and third color filters.

* * * * *